(12) United States Patent
Yeh

(10) Patent No.: US 10,756,100 B2
(45) Date of Patent: Aug. 25, 2020

(54) NOR MEMORY CELL WITH L-SHAPED FLOATING GATE

(71) Applicant: GREENLIANT IP, LLC c/o Greenliant Systems, Inc., Santa Clara, CA (US)

(72) Inventor: Bing Yeh, Los Altos Hills, CA (US)

(73) Assignee: GREENLIANT IP LLC, Santa Clara, CA (US)

(*) Notice: Subject to any disclaimer, the term of this patent is extended or adjusted under 35 U.S.C. 154(b) by 0 days.

(21) Appl. No.: 16/122,795

(22) Filed: Sep. 5, 2018

(65) Prior Publication Data

US 2019/0088667 A1 Mar. 21, 2019

Related U.S. Application Data

(60) Provisional application No. 62/559,414, filed on Sep. 15, 2017.

(51) Int. Cl.
*H01L 27/11556* (2017.01)
*H01L 21/28* (2006.01)
(Continued)

(52) U.S. Cl.
CPC .... *H01L 27/11556* (2013.01); *G11C 16/0416* (2013.01); *G11C 16/14* (2013.01);
(Continued)

(58) Field of Classification Search
CPC ......... H01L 29/40114; H01L 27/11556; H01L 27/11521; H01L 29/66825; H01L 29/7881;
(Continued)

(56) References Cited

U.S. PATENT DOCUMENTS

| | | | |
|---|---|---|---|
| 9,293,204 B2* | 3/2016 | Do | H01L 29/66825 |
| 2004/0183121 A1* | 9/2004 | Yeh | H01L 27/105 257/315 |
| 2005/0045940 A1* | 3/2005 | Chen | H01L 27/115 257/315 |
| 2006/0043459 A1 | 3/2006 | Chen | |

(Continued)

FOREIGN PATENT DOCUMENTS

| | | |
|---|---|---|
| CN | 101419972 A | 4/2009 |
| EP | 1059673 A2 | 12/2000 |

OTHER PUBLICATIONS

Yeh, Non-Final Office Action, U.S. Appl. No. 16/122,800, dated Jul. 10, 2019, 7 pgs.
(Continued)

*Primary Examiner* — Mushfique Siddique
(74) *Attorney, Agent, or Firm* — Morgan, Lewis & Bockius LLP

(57) ABSTRACT

An electrically erasable programmable nonvolatile memory cell includes a semiconductor substrate having a first substrate region and a second substrate region apart from the first substrate region in a lateral direction, a channel region between the first substrate region and the second substrate region, an electrically conductive control gate insulated from and disposed over a first channel portion of the channel region, an electrically conductive floating gate insulated from and disposed over a second channel portion of the channel region, an electrically conductive source line electrically connected to the second substrate region, and an electrically conductive erase gate insulated from and disposed over a tip of the floating gate.

21 Claims, 9 Drawing Sheets

(51) Int. Cl.
- *H01L 29/788* (2006.01)
- *H01L 29/66* (2006.01)
- *H01L 27/11521* (2017.01)
- *G11C 16/26* (2006.01)
- *G11C 16/04* (2006.01)
- *G11C 16/14* (2006.01)
- *G11C 16/24* (2006.01)
- *H01L 23/522* (2006.01)
- *H01L 29/423* (2006.01)
- *G11C 16/00* (2006.01)

(52) U.S. Cl.
CPC .............. *G11C 16/24* (2013.01); *G11C 16/26* (2013.01); *H01L 23/5222* (2013.01); *H01L 27/11521* (2013.01); *H01L 29/40114* (2019.08); *H01L 29/42328* (2013.01); *H01L 29/42336* (2013.01); *H01L 29/66825* (2013.01); *H01L 29/7881* (2013.01); *G11C 2216/04* (2013.01)

(58) Field of Classification Search
CPC ......... H01L 29/42336; H01L 29/42328; H01L 23/5222; G11C 16/0416; G11C 16/26; G11C 16/24; G11C 16/14; G11C 2216/04
See application file for complete search history.

(56) References Cited

U.S. PATENT DOCUMENTS

| | | | | |
|---|---|---|---|---|
| 2006/0157773 | A1* | 7/2006 | Yu | H01L 27/115 257/314 |
| 2006/0223262 | A1* | 10/2006 | Zheng | H01L 29/42324 438/257 |
| 2006/0234444 | A1* | 10/2006 | Wu | H01L 27/115 438/257 |
| 2007/0262368 | A1* | 11/2007 | Chang | H01L 27/115 257/314 |
| 2008/0042183 | A1* | 2/2008 | Mokhlesi | H01L 27/115 257/314 |
| 2019/0088668 | A1* | 3/2019 | Yeh | G11C 16/0416 |

OTHER PUBLICATIONS

Yeh, Notice of Allowance, U.S. Appl. No. 16/122,800, dated Nov. 18, 2019, 7 pgs.
Greenliant IP LLC, International Preliminary Report on Patentability, PCT/US2018/049875, dated Mar. 17, 2020, 9 pgs.
Greenliant IP LLC, International Search Report/Written Opinion, PCT/US2018/049875, dated Nov. 27, 2018, 11 pgs.
Greenliant IP LLC, International Preliminary Report on Patentability, PCT/US2018/049877, dated Mar. 17, 2020, 7 pgs.
Greenliant IP LLC, International Search Report/Written Opinion, PCT/US2018/049877, dated Nov. 29, 2018, 9 pgs.

* cited by examiner

NOR MEMORY CELL WITH L-SHAPED FLOATING GATE

RELATED APPLICATIONS

This application claims priority to U.S. Provisional Application No. 62/559,414, filed Sep. 15, 2017, entitled "NOR Memory Cell with L-Shaped Floating Gate," which is hereby incorporated by reference in its entirety.

This application is related to U.S. patent application Ser. No. 16/122,800, entitled "NOR Memory Cell with Vertical Floating Gate," which claims priority to U.S. Provisional Application No. 62/559,418, filed Sep. 15, 2017, entitled "NOR Memory Cell with Vertical Floating Gate," each of which is hereby incorporated by reference in its entirety.

TECHNICAL FIELD

This relates generally to semiconductor memory devices, including but not limited to electrically programmable and erasable nonvolatile memory cells, sometimes called NOR memory cells, having an L-shaped floating gate.

BACKGROUND

There is a constant need to shrink the size of electrically programmable and erasable nonvolatile memory cells. However, as memory cell sizes scale down, dimension size changes result in changes in capacitive coupling between memory cell elements, and in the widths of various critical regions, all of which have the potential to negatively affect the operation margin of the memory cells, unless significant design changes are made to the structure of the memory cell. Further, as floating gate sizes scale down, an erased floating gate has decreased capacity for storing positive charges, which leads to lower signal-to-noise (SNR) ratios and higher error rates unless design changes are made to compensate.

SUMMARY

In accordance with some embodiments, an electrically erasable programmable nonvolatile memory cell, sometimes called a NOR memory cell, includes a substrate having a drain region, a source region, and a channel region between the drain region and source region. The memory cell further includes an electrically conductive control gate separated from a first channel sub-region by a control gate insulation region. The memory cell further includes an electrically conductive L-shaped floating gate, including a first, horizontal first portion separated from a second channel sub-region by a floating gate insulation region, and a second, vertical portion electrically connected to the first portion. The second floating gate portion extends vertically from the first floating gate portion and away from the substrate, and is strongly capacitively coupled to a source line that extends vertically from the source region. The memory cell further includes an electrically conductive erase gate disposed over and separated by an erase gate insulation region from the second portion of the floating gate.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

DESCRIPTION OF EMBODIMENTS

Figure 1A:
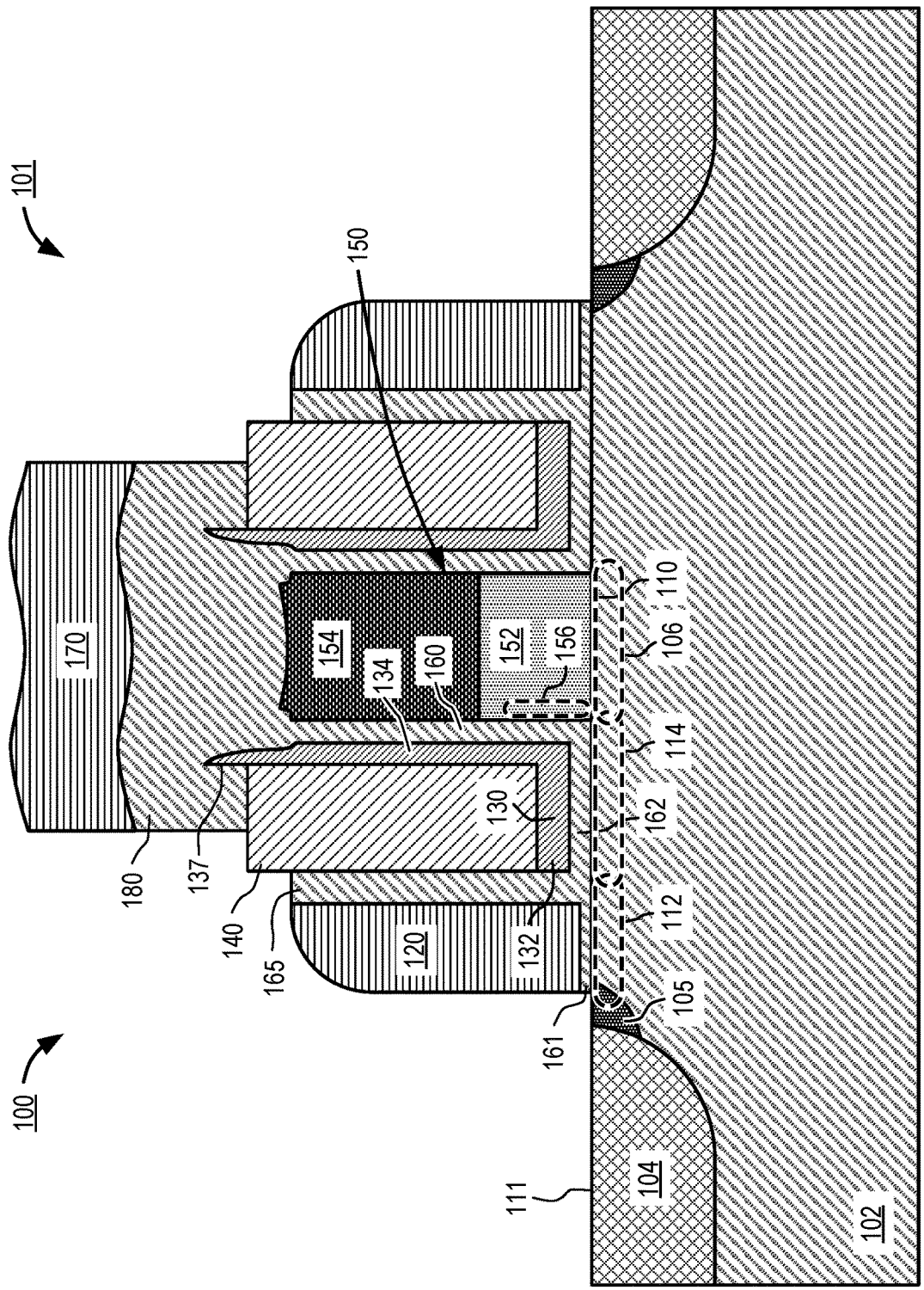
FIG. 1A is a diagram illustrating a cross section view of a pair of electrically erasable programmable nonvolatile memory cells in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact, unless the context clearly indicates otherwise.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when," or "upon," or "in response to determining," or "in response to detecting," depending on the context. Similarly, the phrase "if it is determined" or "if [a stated condition or event] is detected" is, optionally, construed to mean "upon determining," or "in accordance with a determination that," or "in response to determining" or "upon detecting [the stated condition or event]" or "in response to detecting [the stated condition or event]," depending on the context.

As split-gate non-volatile memory cell sizes scale down, maintaining a strong capacitive coupling between the floating gate and the source line of such memory cells becomes more challenging. As will be discussed in more detail below, a strong capacitive coupling between the floating gate and the source line results in more efficient erasing, due to the ability to set a large initial voltage difference between the erase gate and the floating gate during an erase operation.

Further, as split-gate memory cell sizes scale down, an insulation width between the floating gate and the control gate decreases, and maintaining a low capacitive coupling between the floating gate and the control gate becomes more challenging. A low capacitive coupling between the floating gate and the control gate results in more efficient programming, due to the ability to maintain a large voltage difference between inversion channel portions, thereby contributing to hot electron injection during a programming operation.

Further, as floating gate sizes scale down, an erased floating gate has decreased capacity for storing positive charges. Fewer positive charges in an erased floating gate leads to lower signal-to-noise (SNR) ratios and higher error rates.

Accordingly, as memory cell sizes scale down, there is a need to maintain a strong capacitive coupling between the floating gate and the source line, a low capacitive coupling between the floating gate and the control gate, and a high electric charge storage capacity in the floating gate. Such methods and devices optionally complement or replace conventional methods and devices for programming, erasing, and reading data in nonvolatile memory cells.

Such methods and devices maintain a strong capacitive coupling between the floating gate and the source line of nonvolatile memory cells by disposing a vertical portion of an L-shaped floating gate adjacent to a vertical source line. A vertical portion of an L-shaped floating gate provides very strong capacitive coupling with an adjacent source line, due to increased surface area of portions of the floating gate that are adjacent to the source line, which enhances the tunneling mechanism used during erase operations, thereby improving erase efficiency. Such methods and devices further enhance erase efficiency by disposing a pointed tip at an upper end of the vertical portion of an L-shaped floating gate, which focuses the electric field during the erase operation.

Such methods and devices maintain a low capacitive coupling between the floating gate and the control gate of nonvolatile memory cells by disposing a horizontal portion of an L-shaped floating gate adjacent to the control gate. A horizontal portion of an L-shaped floating gate provides very weak capacitive coupling with an adjacent control gate, due to decreased surface area of portions of the floating gate that are adjacent to the control gate, thereby improving programming efficiency.

Such methods and devices maintain a high floating gate charge storage capacity by providing an L-shaped floating gate with increased surface area. The increased number of positive charges that can be stored on the floating gate in an erased mode improves the SNR, thereby resulting in less read errors.

In accordance with some embodiments, an electrically erasable programmable nonvolatile memory cell, sometimes called a split-gate NOR memory cell, includes a substrate having a drain region, a source region, and a channel region between the drain region and source region. The channel region includes a first channel sub-region adjacent the drain region and a second channel sub-region adjacent the source region and positioned between the first channel sub-region and the source region. The memory cell further includes an electrically conductive control gate separated from the first channel sub-region by a control gate insulation region. The memory cell further includes an electrically conductive floating gate. The floating gate has a first portion separated from the second channel sub-region by a floating gate insulation region and a second portion electrically connected to the first portion. The second floating gate portion extends vertically from the first floating gate portion and away from the substrate. The first floating gate portion has a first vertical extent relative to the substrate and the second floating gate portion has a second vertical extent relative to the substrate. The memory cell further includes an electrically conductive source line, electrically connected to the source region, which extends vertically away from the substrate, and which is separated from the second portion of the floating gate by a source line insulation region. The memory cell further includes an electrically conductive erase gate disposed over and separated by an erase gate insulation region from the second portion of the floating gate.

Attention is now directed toward embodiments of an electrically erasable programmable nonvolatile memory cell, sometimes called a NOR memory cell, or split-gate NOR memory cell, in accordance with some embodiments. FIG. 1A is a cross section of a pair of memory cells 100, 101. The memory cells mirror each other, with a memory cell formed on each side of, and including, a shared source line 150. In the interest of brevity, the remainder of this disclosure references only one memory cell, memory cell 100. However, it is appreciated that neighboring memory cell 101 has corresponding features and behaves similarly under similar circumstances.

In some embodiments, memory cell 100 includes a semiconductor substrate 102 having a first substrate region 104 (sometimes called a drain region) and a second substrate region 106 (sometimes called a source interface region). In some embodiments, the first substrate region 104 serves as a drain, although it is appreciated that the source and drain of a transistor can be switched during operation. Furthermore, in some embodiments, the drain includes substrate region 104 as well as substrate region 105, where region 105 is a shallower doped region (e.g., a moderately N-doped region in a P doped substrate) than region 104. The source interface region 106 of substrate 102 comprises an interface portion, adjacent a PN junction interface 110 between substrate 102 and source line 150. In some embodiments, interface 110 is disposed at a surface of substrate 102, such as surface 111. However, in other embodiments, interface 110 is disposed above surface 111. In yet other embodiments, interface 110 is disposed below surface 111 of substrate 102 (not shown).

In some embodiments, memory cell 100 further includes a channel region between drain region 104 and source interface region 106. In some embodiments, the channel region includes a first channel portion 112 adjacent to drain region 104, and a second channel portion 114 adjacent to first channel portion 112 and source interface region 106. For the purposes of this disclosure, "channel region" and "channel portion" are used to describe an area or a path through which electrons flow in certain circumstances. Substrate 102 further includes a horizontal surface 111, disposed over the drain region 104 and extending in a lateral direction towards source line 150.

In some embodiments, memory cell 100 further includes an electrically conductive control gate 120 insulated from and disposed over the first channel portion 112, and an electrically conductive floating gate 130 insulated from and disposed over the second channel portion 114. In some embodiments, floating gate 130 comprises a horizontal portion 132 and a vertical portion 134, and an insulation layer 140 (sometimes referred to as a gate separation insulation region, or an oxide layer) is disposed over horizontal portion 132 and between vertical portion 134 and control gate 120.

It is noted that while control gate 120 is disposed over first channel portion 112, control gate 120 is not disposed over second channel portion 114. As a result, when an inversion layer is formed under control gate 120, in first channel portion 112, due to an appropriate read mode control voltage or programming mode control voltage being put on control gate 120, at least a portion of second channel portion 114 does not include an inversion layer if the memory cell is in the programmed state. In other words, while the inversion layer caused by control gate 120 in first channel portion 112 may, in some circumstances or in some embodiments, extend partially into second channel portion 114, that inversion layer caused by control gate 120 does not extend into other portions of second channel unless further influenced by floating gate 130. In some embodiments, second channel portion 114 has a lateral dimension, corresponding to a distance between first channel portion 112 and source interface region 106, between 15 and 70 nanometers.

Figure 1B:
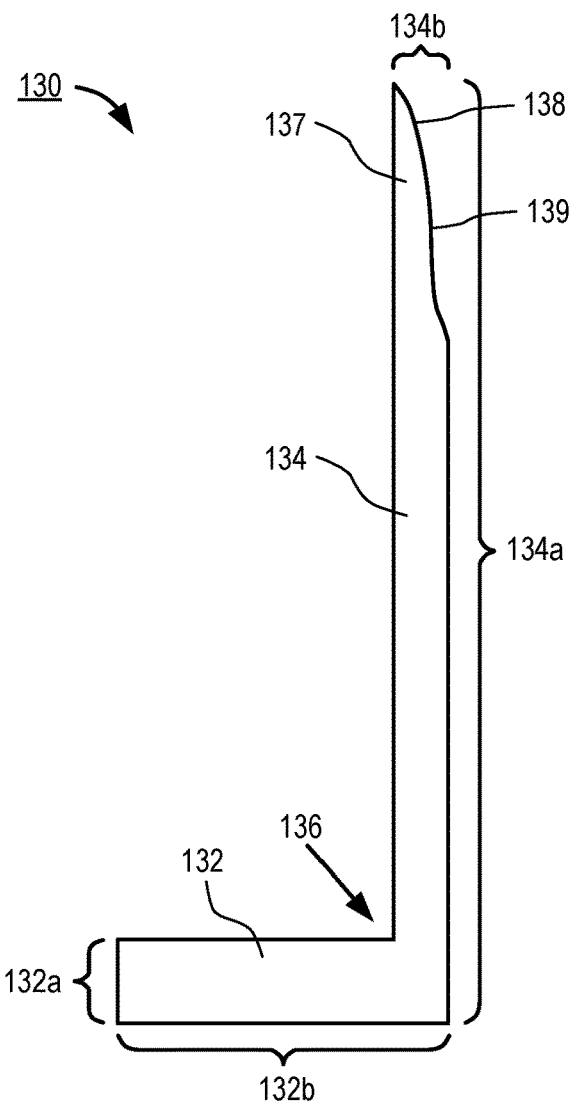
FIG. 1B is a diagram illustrating an L-shaped floating gate in accordance with some embodiments.

FIG. 1B illustrates a more detailed view of floating gate 130. In some embodiments, floating gate 130 includes a first floating gate portion 132 and a second floating gate portion 134. In some embodiments, first floating gate portion 132 is substantially horizontal (e.g., parallel to substrate surface 111, or having an angle of offset no greater than 15 degrees relative to substrate surface 111). In some embodiments, second floating gate portion 134 is substantially vertical (e.g., perpendicular to substrate surface 111 or to first floating gate portion 132, or having an angle of offset between 75 and 105 degrees relative to at least one of substrate surface 111 and first floating gate portion 132). Stated differently, first and second floating gate portions 132 and 134 are substantially perpendicular to each other (e.g., having an angle of offset no less than 75 degrees and no greater than 105 degrees, relative to each other). First and second floating gate portions 132 and 134 meet at shared end 136, forming an L-shaped floating gate in accordance with some embodiments.

First floating gate portion 132 has a vertical extent 132a and a horizontal extent 132b, while second floating gate portion 134 has a vertical extent 134a and a horizontal extent 134b. In some embodiments, vertical extent 134a is longer than vertical extent 132a (e.g., at least 3 times as long as vertical extent 132a, or between 3 and 10 times as long as vertical extent 132a). In some embodiments, horizontal extent 132b is longer than horizontal extent 134b (e.g., at least 3 times as long as horizontal extent 134b, or between 3 and 10 times as long as horizontal extent 134b).

In some embodiments, second floating gate portion 134 is longer (e.g., as measured by vertical extent 134a) than first floating gate portion 132 (e.g., as measured by horizontal extent 132b). In some embodiments, second floating gate portion 134 is at least two times as long as first floating gate portion 132, and more specifically, in some embodiments, between 2 and 5 times as long as first floating gate portion 132. However, in other embodiments, first floating gate portion 132 is longer than second floating gate portion 134.

In further embodiments, a length of first floating gate portion 132 is differs from a length of second floating gate portion 134 by no more than twenty-five percent.

In some embodiments, second floating gate portion 134 has a first end 136 at which second floating gate portion 134 is electrically connected to first floating gate portion 132. In some embodiments, second floating gate portion 134 has a second end 137 including a tip with a first tip portion 138 and a second tip portion 139. In some embodiments, first tip portion 138 has a smaller cross section than second tip portion 139. Second end 137 is sometimes herein called a pointed tip, and the ratio of the cross section of first tip portion 138 to the cross section of second tip portion 139 is sometimes used as a measure of the sharpness of the pointed tip.

Returning to FIG. 1A, memory cell 100 further includes an electrically conductive source line 150 electrically connected to source interface region 106 through interface 110 in accordance with some embodiments. Source line 150 extends away from the substrate in a vertical direction (e.g., in a direction substantial perpendicular to the lateral direction). In some embodiments, source line 150 includes a first source line portion 152 electrically connected to source interface region 106, and a second source line portion 154 disposed above the first source line portion 152. In some embodiments, first source line portion 152 is relatively lightly doped (e.g., n-polysilicon), and second source line portion 154 is more heavily doped (e.g., n+ polysilicon). In some embodiments, first source line portion 152 is lightly doped polysilicon that has been converted into single crystal silicon. In some embodiments, sidewall region 156 of source line 150 is disposed on a sidewall portion of the source line beginning at substrate surface 111, adjacent the location where second channel portion 114 meets source interface region 106, and extending vertically up the sidewall of the source line.

In some embodiments, memory cell 100 further includes insulation layer 160, sometimes called a source line insulation region, between at least a portion of vertical floating gate portion 134 and at least a portion of source line 150. In some embodiments, insulation layer 160 is a "thin" dielectric layer, so as to provide a strong capacitive coupling between floating gate 130 and source line 150. In some embodiments, insulation layer 160 comprises material with a high dielectric constant (e.g., a combination of oxide and nitride). In some embodiments, insulation layer 160 has a combined total thickness of no more than 10 nm, or more specifically, in some embodiments, between 6 nm and 10 nm.

In some embodiments, memory cell 100 further includes an electrically conductive erase gate 170 insulated from and disposed over tip 137 of vertical floating gate portion 134. Erase gate 170 is insulated from the second floating gate portion 137 by an insulation layer 180, sometimes called an erase gate insulation region, disposed between the erase gate and the vertical gate portion. In some embodiments, erase gate 170 is further disposed over at least a portion of source line 150. In some embodiments, the capacitive coupling between floating gate 130 and erase gate 170 is much weaker than the capacitive coupling between floating gate 130 and source line 150, which is beneficial for efficiently and quickly erasing the memory cell (explained in more detail below). In some embodiments, the capacitive coupling between the floating gate and the source line is greater than the capacitive coupling between the floating gate and the erase gate by a ratio of at least 5 to 1 (i.e., the capacitive coupling ratio is at least 5 to 1), and in some embodiments the capacitive coupling ratio, of the capacitive coupling between the floating gate and the source line to the capacitive coupling between the floating gate and the erase gate, is at least 10 to 1, or 9 to 1, or 2 to 1. The strong capacitive coupling between the floating gate and the source line (compared to the capacitive coupling between the floating gate and the erase gate) is caused by the proximity of the floating gate to the source line, as well as the large surface area of the vertical face of vertical floating gate portion 134 that is in close proximity to the source line.

In some embodiments, similar capacitive coupling ratios exist for the floating gate and the source line versus the floating gate and the control gate. More specifically, in some embodiments, the capacitive coupling between the floating gate and the source line is greater than the capacitive coupling between the floating gate and the control gate by a ratio of at least 5 to 1 (i.e., the capacitive coupling ratio is at least 5 to 1), and in some embodiments the capacitive coupling ratio, of the floating gate—source line capacitive coupling to the floating gate—control gate capacitive coupling, is at least 10 to 1, or 9 to 1, or 2 to 1.

In some embodiments, memory cell 100 further includes an insulation layer 161, sometimes called a control gate insulation region, disposed between control gate 120 and at least a portion of first channel portion 112. In some embodiments, memory cell 100 further includes an insulation layer 162, sometimes called a floating gate insulation region, disposed between horizontal floating gate portion 132 and at least a portion of substrate 102, including second channel portion 114. In some embodiments, insulation layers 161 and 162 are connected. In some embodiments, insulation layer 162 is thicker than insulation layer 161. In some embodiments, compared with a conventional silicon oxide layer, insulation layer 162 provides a lower interface energy barrier (sometimes called an energy barrier height) for hot electrons to overcome in order to be injected into floating gate 130. In some embodiments, the low interface energy barrier provided by the dielectric material of insulation layer 162 is less than 2.5 eV (electron volts), and in some embodiments is less than 2.0 eV, or less than 1.3 eV. In some embodiments, memory cell 100 further includes an insulation layer 165 disposed between insulation layer 140 and control gate 120. In some embodiments, insulation layer 165 is disposed over substrate surface 111 at a region of substrate 102 where first and second channel portions 112 and 114 meet.

In some embodiments, conductive elements of memory cell 100 (e.g., control gate 120, floating gate 130, source line 150, and/or erase gate 170) are constructed of appropriately doped polysilicon. It is appreciated that "polysilicon" refers to any appropriate conductive material, formed at least in part from silicon or metal material, that can be used to form the conductive elements of nonvolatile memory cells. In addition, in accordance with some embodiments, insulation elements of memory cell 100 (e.g., insulation layers 140 and 180) are constructed of silicon dioxide, silicon nitride, and/or any appropriate insulator that can be used to form the insulation elements of nonvolatile memory cells.

Attention is now drawn to the channel portions of memory cell 100. In some embodiments, first and second channel portions 112 and 114 form a continuous channel region extending from drain region 104/105 to source interface region 106, in the lateral direction. Additionally, first and second channel portions 112 and 114 extend in the vertical direction to include substrate surface 111. In some embodiments, first and second channel portions 112 and 114 are adjacent to each other or overlap with each other, and in some embodiments, the first channel portion 112 overlaps with the drain region 104/105.

Figure 2:
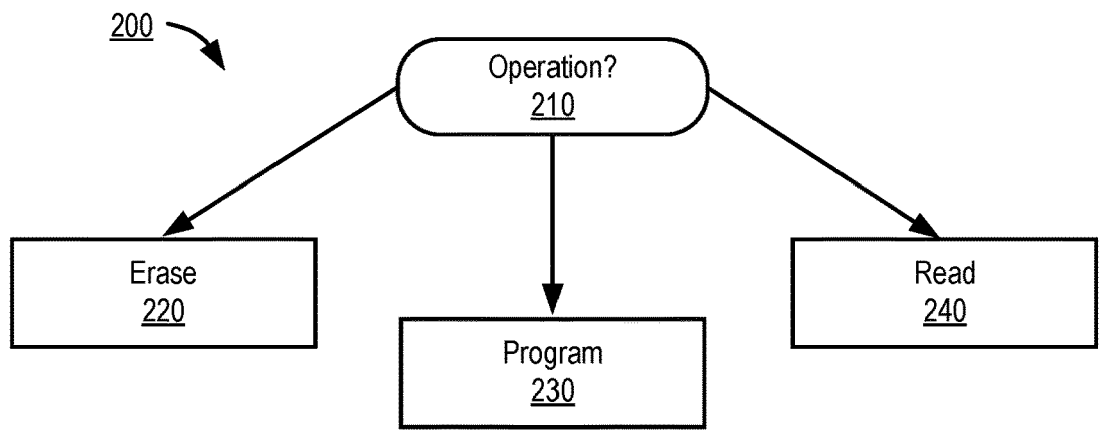
FIG. 2 is a flow chart illustrating operation flow in an electrically erasable programmable nonvolatile memory cell in accordance with some embodiments.

Operation of the memory cell 100 in accordance with some embodiments will now be described. FIG. 2 is a flow chart illustrating an operation flow 200 for a memory cell 100 in accordance with some embodiments. Operation flow 200 begins at step 210, at which a memory controller proceeds to either erase memory cell 100 (e.g., while erasing a row of memory cells including memory cell 100) (step 220), program a memory cell 100 that has previously been erased (step 230), or read from a memory cell 100 that has previously been programmed or erased (step 240). In some embodiments, operation flow 200 includes concurrent erase and program operations on different memory cells, and in some embodiments, operation flow 200 includes concurrent erase and read operations on different memory cells.

Erase Operation

To erase the memory cell (step 220) in accordance with some embodiments, a first bias potential (e.g., ground potential) is applied to both the control gate 120 and the source line 150, and a second bias potential (e.g., a positive potential) is applied to the erase gate 170. Typically, a difference between the second bias potential and the first bias potential is no greater than 10 volts. Since the floating gate 130 is highly capacitively coupled to the source line 150, the floating gate potential is pulled down to, or held at a potential just above the ground potential, also herein simply called "ground" or "circuit ground." As a nonlimiting example, for a capacitance ratio of 10/1 (i.e., the floating gate to source line capacitance is ten times the floating gate to erase gate capacitance), if the erase gate potential changes from 0V to 10V (e.g., to start an erase operation) and the source line potential is maintained at 0V, the 10V change in potential in the erase gate causes a change in the floating gate potential of less than 1V.

The difference in potentials between the floating gate and erase gate causes electrons to leave the floating gate. More specifically, electrons on the floating gate 130 are induced through Fowler-Nordheim tunneling (or an equivalent tunneling mechanism) to tunnel from the vertical floating gate portion 134 (primarily from pointed tip 137), through the insulation layer 180, and onto the erase gate 170, leaving the floating gate 130 positively charged. Tunneling of electrons through insulation layer 180, from tip 137 of floating gate 130 to erase gate 170, is enhanced by the sharpness of tip 137. While traditional memory cells may have required 14V or higher for erasing, currently disclosed embodiments require application of no greater than 10V to erase gate 170 (e.g., the voltage applied to erase gate 170, relative to the voltage applied to control gate 120 and source line 150, is no greater than +10V), and even less (e.g., 8V) in some embodiments. In addition to the capacitance ratio, the pointed tip 137 of the vertical floating gate portion 134 also contributes to the lower erase voltage. In particular, the pointed tip 137 of floating gate 130 facilitates the formation of a tightly focused electric field between floating gate 130 and erase gate 170, which in turn facilitates electron tunneling through insulation layer 180, thereby allowing the use of lower erase voltages for any given thickness of insulation layer 180. For example, if a planar floating gate without a pointed tip normally requires an insulation thickness (layer 180) of less than 100 angstroms, having a pointed tip 137 allows the insulation thickness to be up to 700 angstroms and still permit tunneling when only 10V is applied to the erase gate.

Program Operation

Figure 3:
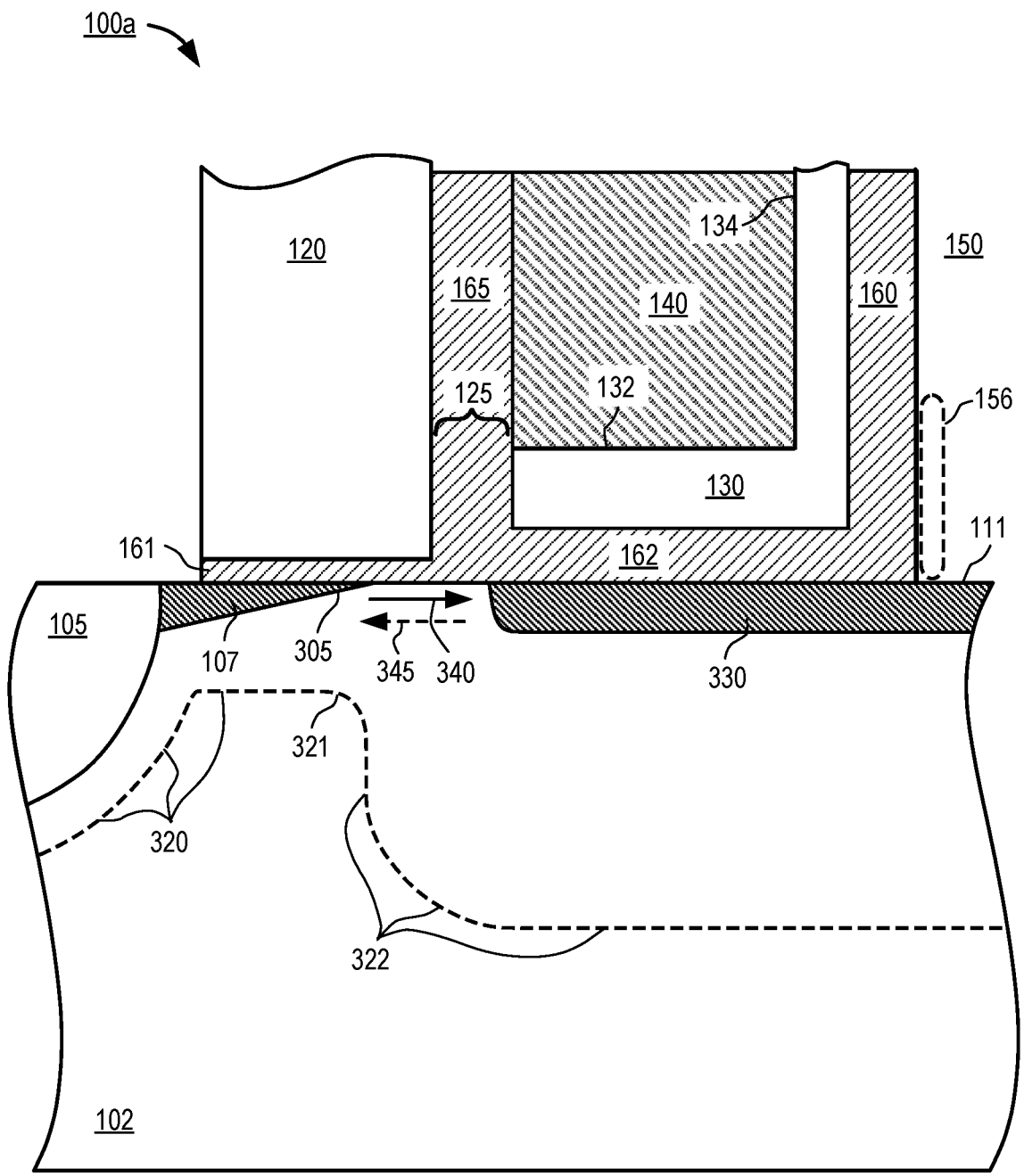
FIG. 3 is a diagram illustrating a programming operation of an electrically erasable programmable nonvolatile memory cell in accordance with some embodiments.

For programming the memory cell (step 230) in accordance with some embodiments, attention is first directed to FIG. 3, which illustrates another view (100a) of memory cell 100 from FIG. 1A during a programming operation. Features shared with FIGS. 1A-B are similarly numbered, and some are not further discussed for purposes of brevity. Additional features depicted in FIG. 3 include a weak inversion layer 107, a first depletion region 320, a second depletion region 322, a floating gate inversion layer 330, a direction of electron flow 340, and an electric field represented by field line 345 (e.g., in the channel region between floating gate inversion lay 330 and inversion layer 107). As is known in the art, electrons are attracted to positive voltage potentials, and are therefore pulled in a direction opposite of electric field line 345 depicted in FIG. 3.

To program the memory cell in accordance with some embodiments, the first bias potential (e.g., ground potential) is applied to the erase gate 170, and a fifth bias potential (e.g., a low voltage, such as 0V, or a voltage between 0V and 0.5 V) is applied to drain region 104/105. A positive voltage level in the vicinity of the threshold voltage of the MOS structure (e.g., on the order of 0.2 to 0.7V above the voltage potential of the drain region) is applied to control gate 120. The voltages applied to drain region 104/105 and control gate 120 form a first depletion region 320 around the drain region 104/105 and channel portion 112 (FIG. 1A) of substrate 102. Further, a sixth bias potential higher than the fifth bias potential is applied to the control gate 120, and a seventh bias potential (e.g., a positive high voltage, for example on the order of 4V to 6V), higher than the sixth bias potential is applied to the source line 150.

The sixth bias potential applied to control gate 120 causes a weak inversion layer 107 to form in the substrate 102, connected to drain region 104/105 and having a pinch off point 305 located underneath control gate 120. Inversion layer 107 has a voltage close to that of drain region 104/105, as the very low sub-threshold current between the drain region and the pinch off point 305 causes only a very small voltage drop between the drain region and the pinch off point 305.

Applying the seventh bias potential (as noted above, a positive high voltage, e.g., on the order of 4V to 6V) to source line 150 causes a voltage of the floating gate 130 to rise in accordance with the seventh bias potential due to capacitive coupling between the source line and the floating gate, thereby causing electrons in a channel region of the substrate to gain energy and to be injected onto the floating gate. Because floating gate 130 is highly capacitively coupled to the source line 150, the voltage transition, e.g., from 0V to 4V, on source line 150 causes the voltage of floating gate 130 to increase proportionately to the voltage increase on source line 150. For example, in some embodiments, the voltage of floating gate 130 increases by at least 80 percent of the change in voltage on source line 150. The resulting voltage on floating gate 130 (e.g., due to floating gate 130 having previously been erased, plus the increase in voltage due to capacitive coupling with source line 150) in conjunction with the high voltage on source line 150 forms a second depletion region 322 (sometimes referred to herein as a deep depletion region) in substrate 102 underneath floating gate 130 and source line 150. Deep depletion region 322 has a larger depletion width than depletion region 320 due to the relatively higher voltage on floating gate 130 and source line 150. The larger depletion region 322 pushes pinch off point 305 toward the drain region 104/105, causing inversion layer 107 to be pinched off underneath control gate 120. The positive charges on floating gate 130 (e.g., due to floating gate 130 having previously been erased) in conjunction with the high voltage on source line 150 further form an inversion layer 330 in channel portion 114 underneath floating gate 130 and in source interface region 106 underneath source line 150 (see FIG. 1A for channel portion 114 and source interface region 106). Inversion layer 330 has a voltage close to that of the source line, which is substantially higher than the voltage of inversion layer 107 (having a voltage close to that of the drain region). This difference in voltages between inversion layers 330 and 107 causes a voltage drop between inversion layer 330 and inversion layer 107. The voltage drop occurs in depletion region 322, in a vicinity of where depletion regions 320 and 322 meet (denoted as 321 in FIG. 3). The resulting electric field due to the voltage drop is represented by field line 345 (FIG. 3). The area of depletion region 322 at region 321 is influenced by a size of the gap 125 between control gate 120 and horizontal floating gate portion 132. Specifically, in some embodiments, since the larger depletion region 322 pushes pinch off point 305 toward the drain region 104/105, causing inversion layer 107 to be pinched off before reaching gap 125, the area of depletion region 322 between inversion layers 107 and 330 is wider than gap 125, and is directly related to the size of gap 125.

At the beginning of a programming operation, a stream of electrons (sometimes called the programming current) from drain region 104/105 flows through inversion layer 107, moving randomly but having a net drift velocity in the direction represented by electron flow 340. The electrons traverse inversion layer 107 and proceed to pinch off point 305. After leaving pinch off point 305, electrons in the programming current are accelerated through depletion region 322 in the direction of electron flow 340 by the electric field represented by field line 345. The accelerated electrons are referred to herein as hot electrons.

As the hot electrons in the programming current travel through depletion region 322 toward inversion layer 330, some of the hot electrons get scattered as a result of collisions with impurities or lattice imperfections in the substrate. Some of those scattered hot electrons with sufficient energy and momentum proceed to break through substrate surface 111 and enter insulation layer 162, located between horizontal floating gate portion 132 and substrate surface 111. In some embodiments, an electron has sufficient energy to enter insulation layer 162 when its energy is higher than the energy barrier height at the interface between the silicon of substrate 102 and the dielectric material of insulation layer 162. After breaking into insulation layer 162, electrons are injected onto floating gate 130.

Electrons traversing depletion region 322 without sufficient energy to break through surface 111 continue through inversion layer 330 to source line 150. In some embodiments, a low resistance accumulation layer forms in sidewall region 156 of source line 150, forming a continuous path for electrons (e.g., electrons that have not broken through surface 111) to flow to higher portions of source line 150.

The injection of electrons onto floating gate 130, sometimes herein called the gate current, continues until either the programming voltages on source line 150 and control gate 120 are removed, or the voltage on floating gate 130 is so reduced by the electrons injected onto floating gate 130 that inversion layer 330 weakens to the point that it can no longer propagate the source line voltage to gap 125, causing electrons in electron flow 340 to no longer have sufficient energy to traverse insulation layer 162. Stated another way, the reduced voltage of the floating gate no longer sustains the potential drop in depletion region 322 to generate hot electrons. At this point, a "programmed state" for the memory cell is reached. In some embodiments, the programming current during a programming operation is in the range of 100 nA to 10 mA, and in some embodiments, the programmed state is reached in less than 100 nanoseconds. In some embodiments, the programming has a self-limiting mechanism to prevent the cell from becoming "over" programmed. This is beneficial, as removing excessive electrons from the cell during erase operations increases the wear of the cell.

Read Operation

Finally, to read a selected memory cell (step 240) in accordance with some embodiments, the first bias potential (e.g., a ground potential) is applied to source line 150. A fourth bias potential (e.g., a read voltage, such as a voltage in the range of 0.5V to 2V) is applied to drain region 104, and a third bias potential, sometimes called the read potential (e.g., a positive voltage, for example approximately 1V to 4V, depending upon the power supply voltage supported by the technology in which the device is made) is applied to control gate 120.

If floating gate 130 is positively charged (e.g., the floating gate is discharged of electrons, for example because the memory cell 100 has been erased and not subsequently programmed), then second channel portion 114 is turned on by the formation of an inversion layer 330. When control gate 120 is raised to the read potential, first channel portion 112 is turned on by the formation of a strong inversion layer 107 in the substrate region below the control gate. In the second channel portion, the two depletion regions overlap with an electric field below the substrate surface 111 pointing from drain region 104/105 toward inversion region 330 under floating gate 130. As a result, the entire channel region, including channel portions 112 and 114 favor an electron current in the direction of drain region 104/015. Accordingly, electrons flow from source line 150 (e.g., from sidewall 156) to drain region 104/105 through inversion layer 330 in channel portion 114, depletion region 322, and inversion layer 107 in channel portion 112. When the resulting electrical current (sometimes called the read current) is sensed, using circuitry in the memory device not shown, the memory cell is sensed to be in the "1" state or, equivalently, the "erased" state.

On the other hand, if the floating gate 130 is neutral or negatively charged, then no inversion layer forms in second channel portion 114. Consequently, the second channel portion 114 is either weakly turned on or entirely shut off and the width of depletion region 322 is reduced compared to the width of depletion region 322 when the floating gate 130 is positively charged (e.g., as a result of an erase operation). Further, the decreased width of depletion region 322 causes the depletion regions 322 and 320 to no longer overlap. Due to the gap in depletion regions, at least a portion of second channel portion 114 is not in a depletion region. As a result, even when control gate 120 and drain region 104 are raised to the read potential, little or no current (sometimes called the read current) flows between source line 150 and drain region 104. In this case, either the read current is very small compared to that of the "1" state, or there is no read current at all. In this manner, the memory cell is sensed to be in the "0" state or, equivalently, in the "programmed" state.

In some embodiments, a ground potential is applied to the drain regions 104, source regions 150, and control gates 120 for non-selected columns and rows so that only the selected memory cell(s) is (are) read.

Plan View of Memory Array

Figure 4:
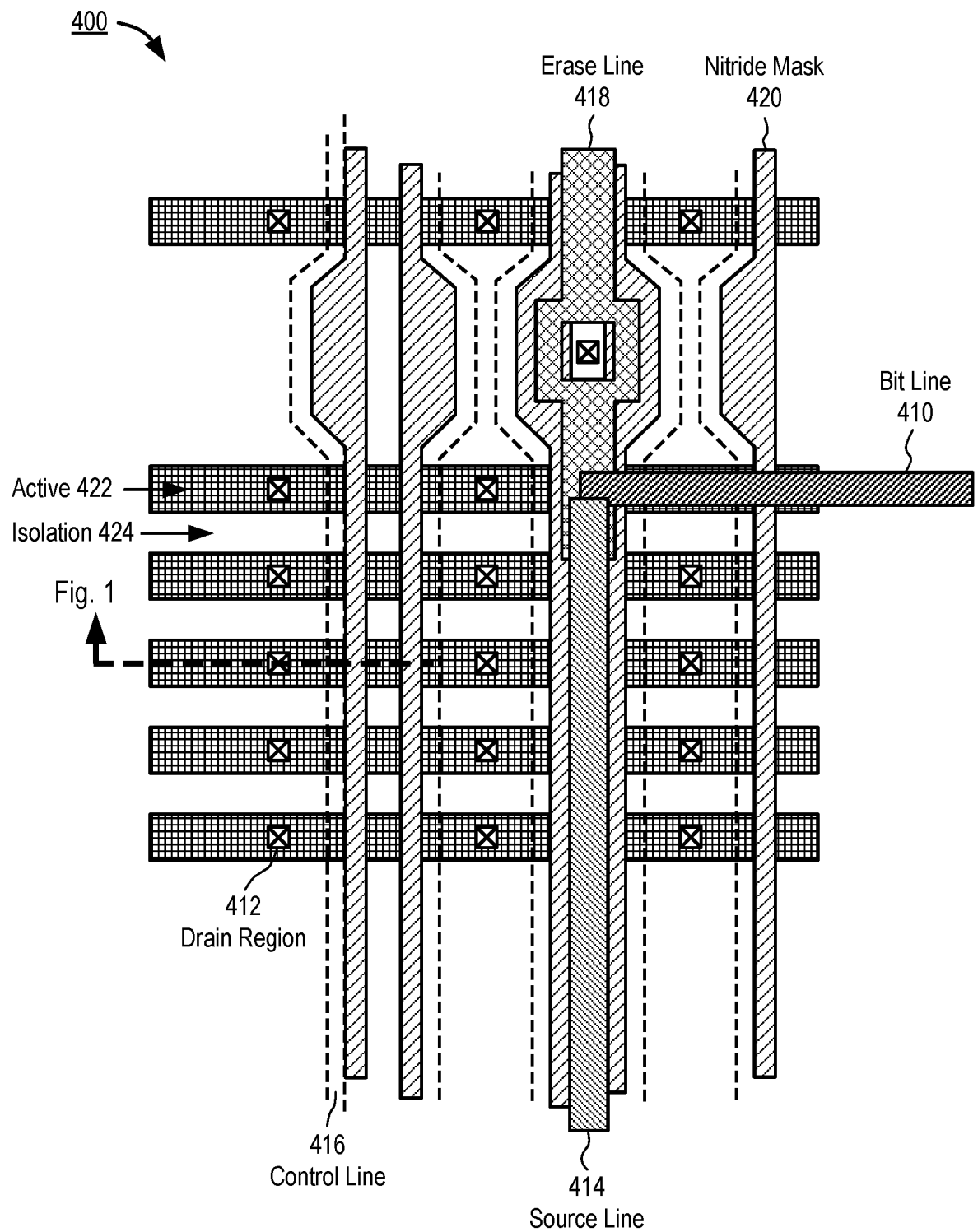
FIG. 4 is a diagram illustrating a plan view of a memory cell array in accordance with some embodiments.

Attention is now directed to FIG. 4, which illustrates a plan view of a memory cell array 400 in accordance with some embodiments. In some embodiments, bit lines 410 interconnect with drain regions 412. Control lines 416 and nitride masks 420 (removed in the manufacturing process) define the source lines, horizontal floating gates, and control gates, and extend across both the active regions 422 and the isolation regions 424. The source lines 414 electrically connect to the source regions for each row of paired memory cells. The floating gates are disposed in trenches in the active regions 422 underneath the erase lines 418.

Manufacturing Process

Figure 5A:
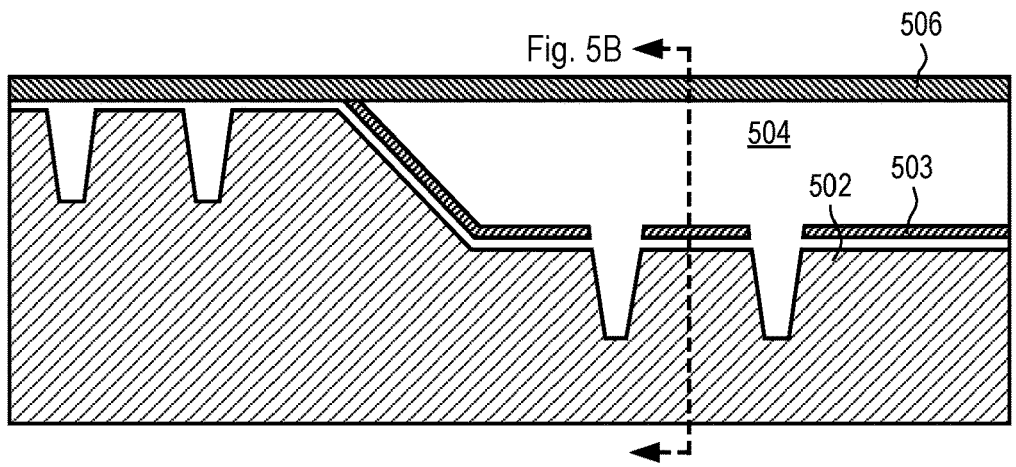
FIGS. 5A-M illustrate a process for manufacturing an array of electrically erasable programmable nonvolatile memory cells in accordance with some embodiments.
Figure 5B:
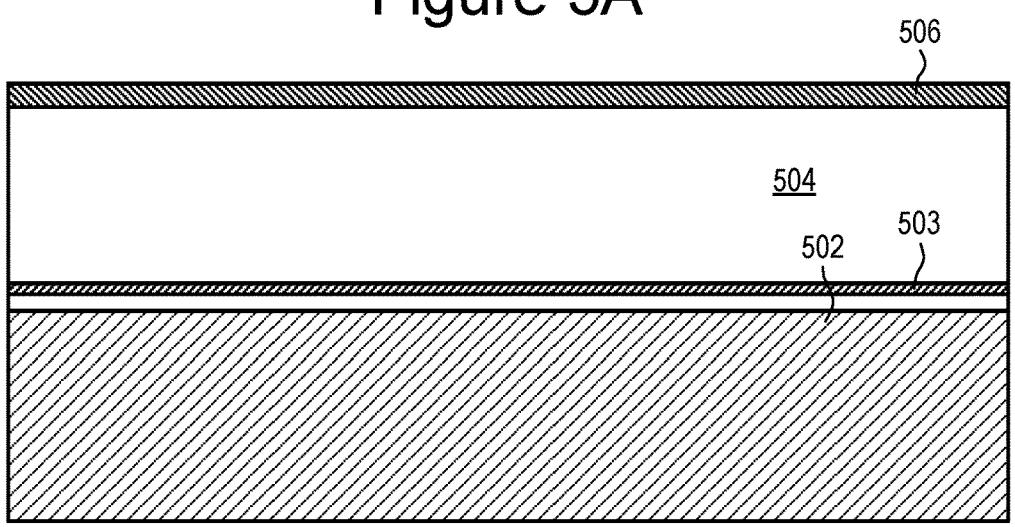
Figure 5C:
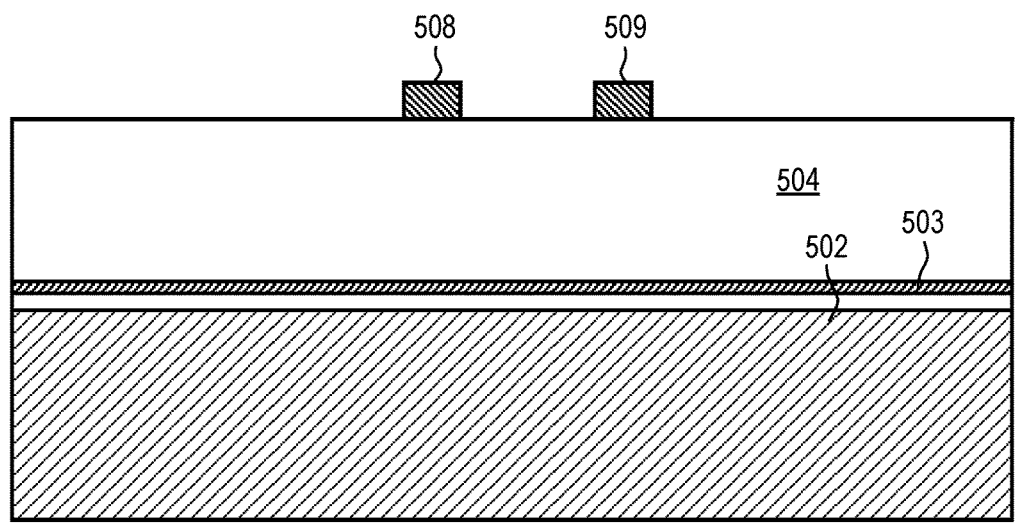

Attention is now directed to FIGS. 5A-M, which illustrate a process for manufacturing a memory cell in accordance with some embodiments. A process in accordance with some embodiments begins in FIG. 5A, which shows a cross-section view of silicon substrate 502, polysilicon layer 503, and oxide layer 504, above which nitride 506 is deposited. A number of isolation trenches have already been removed from substrate 502, and the right hand portion of FIG. 5A shows a region, with oxide layer 504, that has been prepared for memory cell formation. FIG. 5B is another cross-section view, orthogonal to the cross-section view of FIG. 5A, along the bit-line direction (see FIG. 4). Next, as illustrated in FIG. 5C, the nitride layer 506 is etched, leaving a nitride mask with portions 508 and 509.

Figure 5D:
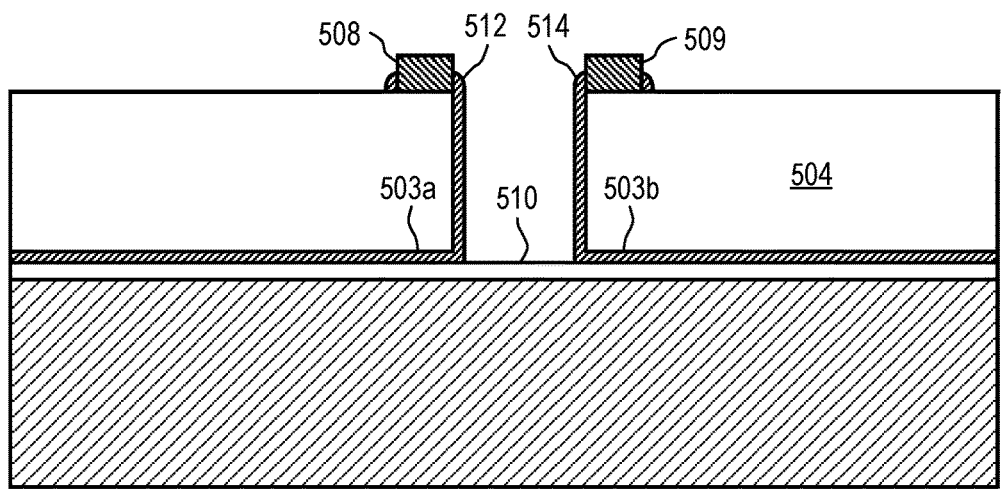
Figure 5E:
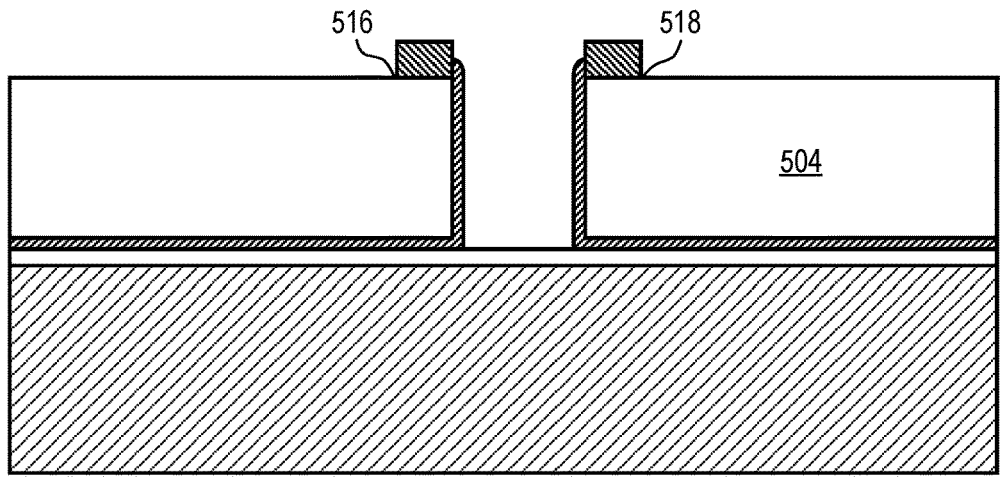
Figure 5F:
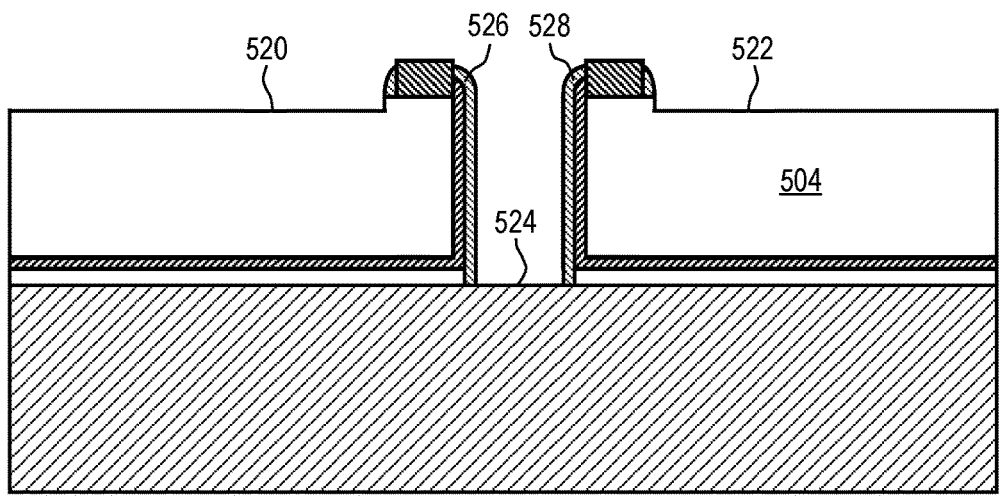

Next, as illustrated in FIG. 5D, a trench is etched through oxide layer 504, stopping at polysilicon layer 503, between nitride mask portions 508 and 509. In some embodiments, the etching is performed by reactive ion etching ("RIE"). After the etching, polysilicon (sometimes herein called "poly") is deposited in and around the trench. Then, poly is etched from trench bottom 510 using RIE in order to leave two vertical poly walls 512 and 514. Poly walls 512 and 514 form the basis for two L-shaped floating gates (e.g., one floating gate comprising poly 512/503a, and another floating gate comprising poly 514/503b). Next, as illustrated in FIG. 5E, after the processing steps of floating gate separation, masking, and etching, leftover poly is isotropically etched from areas 516 and 518. Next, as illustrated in FIG. 5F, a dielectric layer is deposited and then anisotropically etched using RIE, forming coupling dielectric regions 526 and 528. The oxide at areas 520, 522, and 524 is etched away after such processing steps.

Figure 5G:
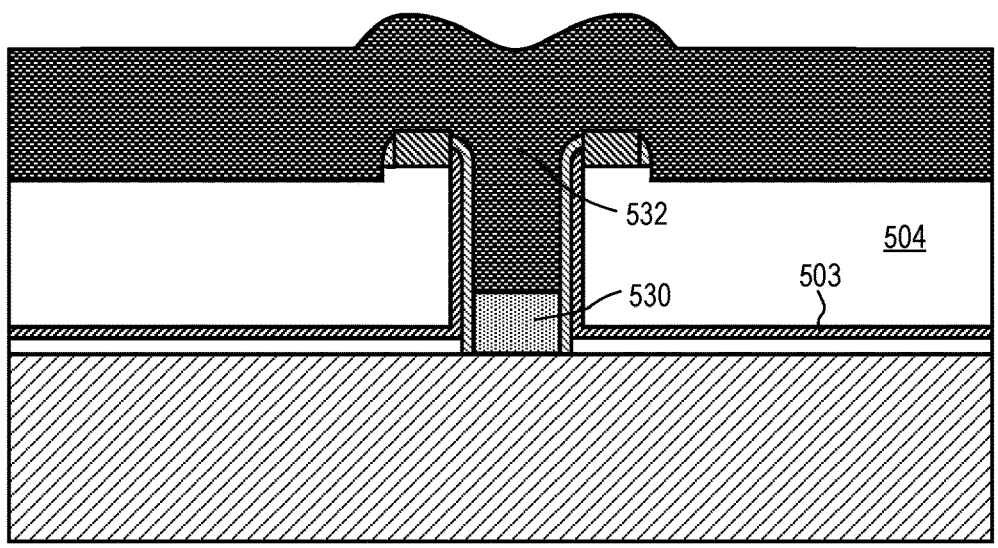
Figure 5H:
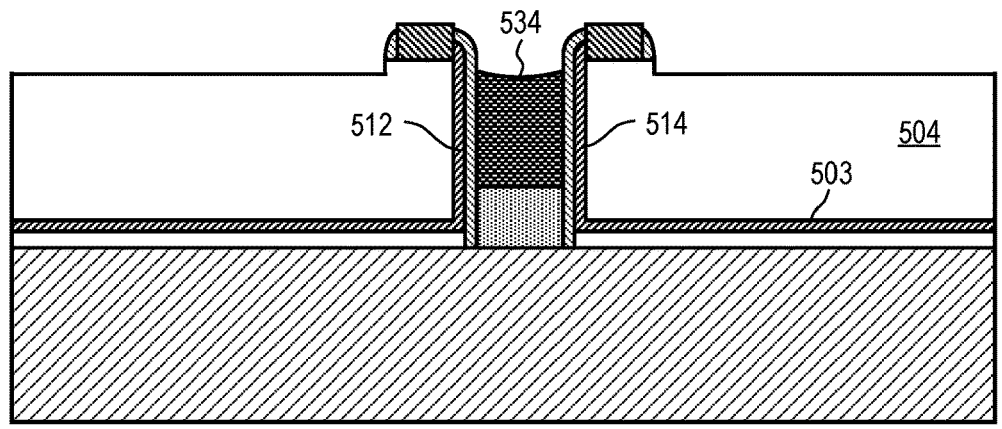

Next, as illustrated in FIG. 5G, to form a source line 534 (see FIG. 5H) in accordance with some embodiments, lightly doped amorphous silicon 530 is first deposited and then converted into single crystal silicon using a solid phase epitaxy ("SPE") process. An N-type dopant (e.g., arsenic or phosphorus) is then implanted and thermally driven in to form a heavily doped N+ layer 532 above the lightly doped silicon in the trench. An isotropic poly etch is then performed to remove the excess silicon outside the trench as shown in FIG. 5H to form the top of the source line 534. In other embodiments, processing steps in FIG. 5G and FIG.

5H are accomplished as follows: layers 530 and 532 are formed by first performing an epitaxial silicon growth step to selectively grow the N-single crystal silicon 530 at the trench bottom, followed by the deposition of heavily doped polysilicon 532. The excess polysilicon 532 outside the trench is isotropically etched away to form the top of the source line 534. As can be seen from the description of how source line 534 is formed, source line 534 and vertical poly wall 512, which will become the vertical portion of floating gate 130 (see FIG. 1A), are self-aligned due to the use of vertical poly walls 512, 514 and coupling dielectric regions 526 and 528 (see FIG. 5F) to define the vertical boundaries of source line 534. Stated another way, the vertical floating gate portion is not lithographically defined in the direction perpendicular to the source line direction (see source line direction in plan view, FIG. 4), and furthermore can tolerate lithographic misalignment in the source line direction with no effect on memory cell electrical characteristics.

Figure 5I:
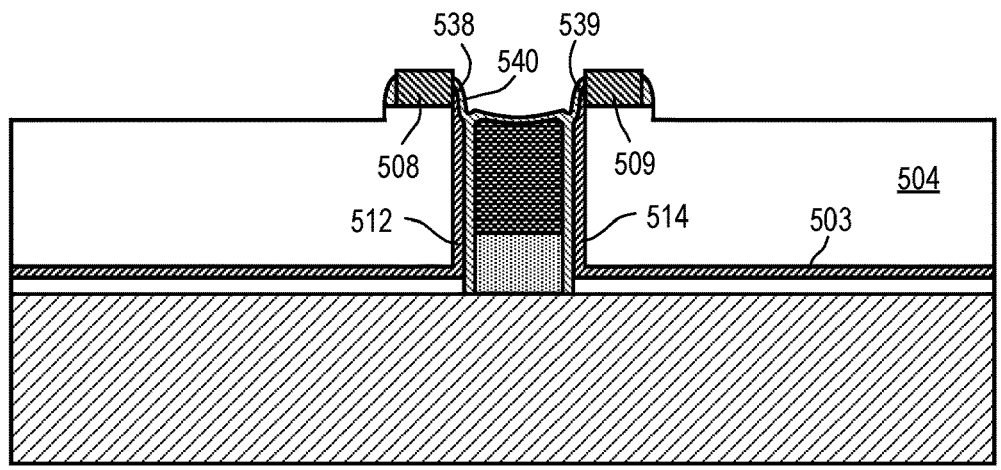

Next, as illustrated in FIG. 5I, a controlled amount of oxide is etched from the top and sides of the nitride mask portions 508 and 509, along with the exposed oxide covering the tip portions 538, 539 of the floating gates 512, 514. Then, a thin oxide layer 540 is thermally grown so as to protect the floating gate tips 538, 539 and the top of the source line silicon. This thermal oxide layer 540 growing step also sharpens the tips 538, 539 of the floating gates 512, 514.

Figure 5J:
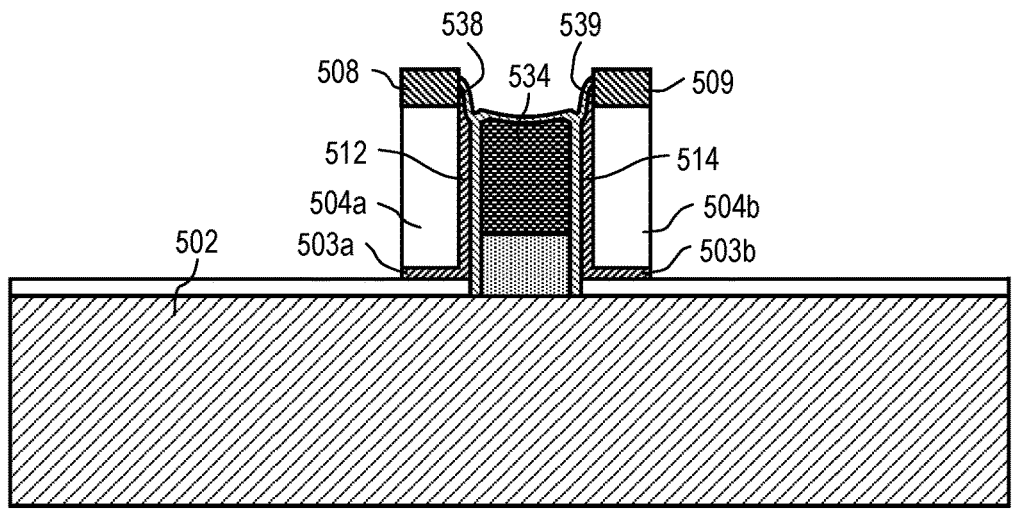
Figure 5K:
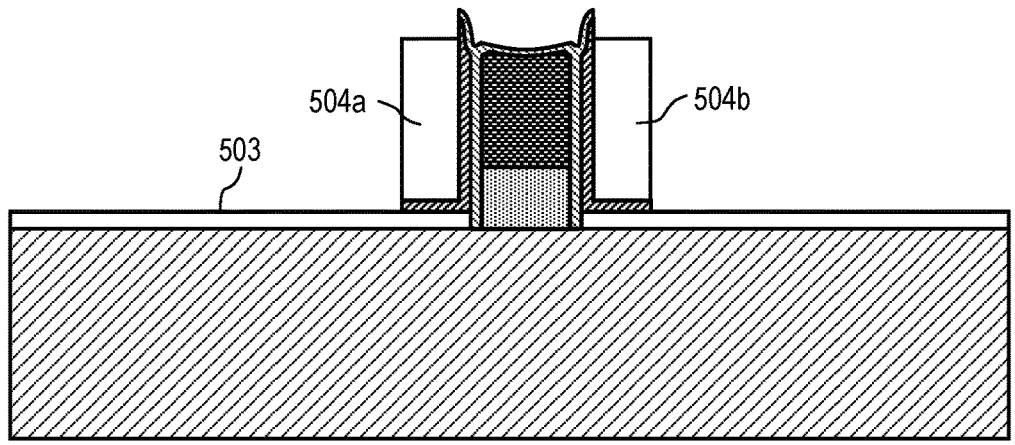
Figure 5L:
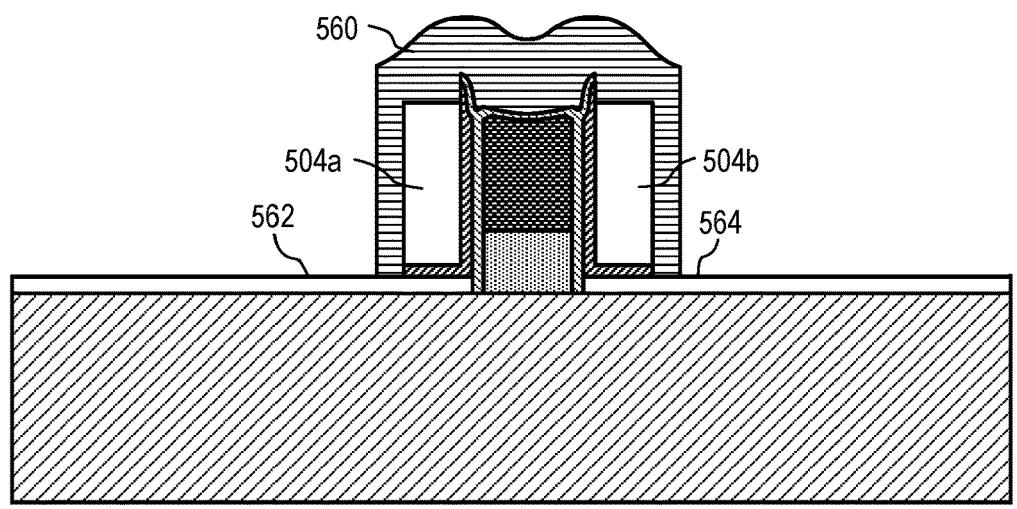
Figure 5M:
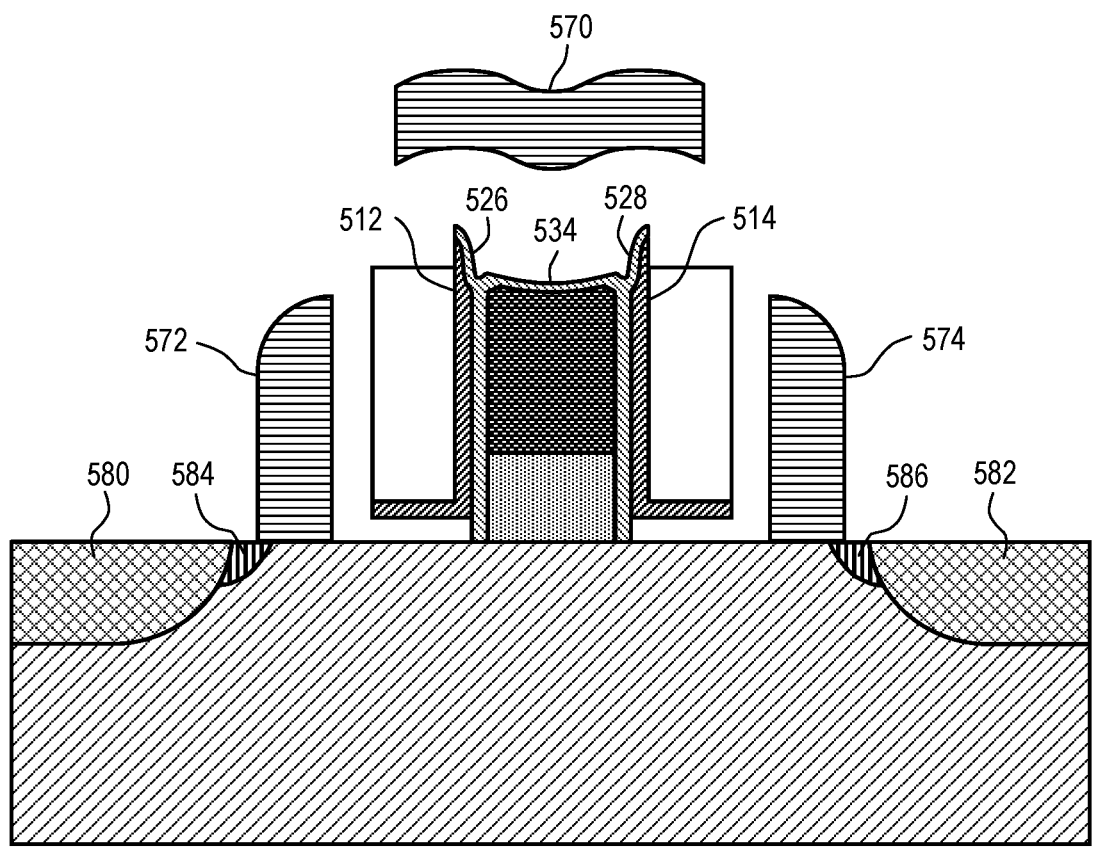

Next, as illustrated in FIG. 5J, oxide layer 504 and poly layer 503 (see FIG. 5I) are etched using RIE. During the etch, nitride masks 508, 509, and another mask (not shown) protect floating gate tips 538, 539 and source line 534. Oxide regions 504a and 504b remain after the etch. In some embodiments, the RIE etch conditions are adjusted in order to minimize damage caused to the silicon 502. Next, as illustrated in FIG. 5K, a thin oxide layer (not shown) is grown above the silicon surface 503 in order to remediate damage to the silicon surface caused by the RIE process for etching oxide layer 504. In some embodiments, the oxidation also further sharpens the tips of the floating gates. Next, the nitride is stripped off of top of oxide regions 504a and 504b. Next, as illustrated in FIG. 5L, HTO (high temperature oxide) 560 is deposited over the memory cell area in order to serve as a tunneling dielectric. In some embodiments, a thickness of the HTO is 100-300 angstroms. In other embodiments, a thickness of the HTO is up to 700 angstroms. In some embodiments, a mask is used to protect the floating gate tips, while HTO 560 is isotropically etched to remove excess oxide, for example along the sidewalls of oxide regions 504a, 504b. In some embodiments, oxide is anisotropically etched to remove oxide from areas 562 and 564 to prepare for formation of the control gates. Next, gate oxide is grown over areas 562 and 564, and poly is deposited, covering the entire memory array area including the gate oxide in regions 562 and 564. The poly is then masked and etched to form control gates 572, 574, as shown in FIG. 5M. In some embodiments, the same masking and etching steps used to form control gates 572, 574 are also used to define the erase gate 570, while in other embodiments erase gate 570 is formed using separate making and etching steps from those used to form control gates 572, 574.

Finally, lightly doped drain regions 584, 586 (e.g., drain regions adjacent control gates 572, 574) and drain regions 580, 582 are formed using processing steps well known in the semiconductor industry to form drain regions that include lightly doped drain (LDD) sub-regions adjacent neighboring transistor gates and more heavily doped drain sub-regions not adjacent the neighboring transistor gates, one example of which is described in U.S. Pat. No. 4,994,404, followed by contact formation and the subsequent metallization and other steps to complete the device manufacturing.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An electrically erasable programmable memory cell comprising:
   a semiconductor substrate having a first substrate region, a second substrate region apart from the first substrate region in a lateral direction;
   a channel region between the first substrate region and the second substrate region, the channel region having:
      a first channel portion adjacent to the first substrate region, and
      a second channel portion adjacent to the second substrate region and the first channel portion;
   an electrically conductive control gate insulated from and disposed over the first channel portion;
   an electrically conductive floating gate insulated from and disposed over the second channel portion, the floating gate having:
      a first floating gate portion extending in the lateral direction over the second channel portion, and
      a second floating gate portion extending away from the substrate, the second floating gate portion being electrically connected to the first floating gate portion on a first end and having a tip on a second end, wherein a first portion of the tip has a smaller cross section than a second portion of the tip;
   an electrically conductive source line electrically coupled to the second substrate region, the source line extending away from the substrate and forming a first capacitive coupling with the floating gate;
   a dielectric layer, including a portion that is both positioned between and in contact with the second floating gate portion and the source line; and
   an electrically conductive erase gate insulated from and disposed over the source line and the tip of the second floating gate portion;
   wherein the first floating gate portion includes a portion that extends, over the second channel portion, further from the source line than the second floating gate portion.

2. The electrically erasable programmable memory cell of claim 1, wherein the first floating gate portion and the second floating gate portion form an L-shaped floating gate.

3. The electrically erasable programmable memory cell of claim 1, wherein the erase gate forms a second capacitive coupling with the floating gate, and wherein the first capacitive coupling is greater than the second capacitive coupling.

4. The electrically erasable programmable memory cell of claim 3, wherein the first capacitive coupling is greater than the second capacitive coupling by a ratio of at least 5 to 1.

5. The electrically erasable programmable memory cell of claim 1, wherein the control gate forms a third capacitive coupling with the floating gate, and wherein the first capacitive coupling is greater than the third capacitive coupling.

6. The electrically erasable programmable memory cell of claim 5, wherein the first capacitive coupling is greater than the third capacitive coupling by a ratio of at least 5 to 1.

7. The electrically erasable programmable memory cell of claim 1, further comprising:
- a control gate insulation region disposed between the control gate and the first channel portion; and
- a floating gate insulation region disposed between the first floating gate portion and the second channel portion.

8. The electrically erasable programmable memory cell of claim 7, wherein the floating gate insulation region is thicker than the control gate insulation region.

9. The electrically erasable programmable memory cell of claim 7, wherein the floating gate insulation region and the control gate insulation region are formed using separate insulation region growing operations.

10. The electrically erasable programmable memory cell of claim 1, further comprising:
- an erase gate insulation region disposed between the erase gate and the tip of the second floating gate portion, the erase gate insulation region having a thickness permitting tunneling of electrons from the tip of the second floating gate portion.

11. The electrically erasable programmable memory cell of claim 10, wherein the erase gate insulation region thickness is greater than 200 angstroms and permits tunneling of electrons upon application of no greater than 10V to the erase gate.

12. The electrically erasable programmable memory cell of claim 1, wherein the control gate comprises a first region disposed a first distance from the first floating gate portion and a second region disposed a second distance from the second floating gate portion, wherein the second distance is greater than the first distance.

13. The electrically erasable programmable memory cell of claim 1, further comprising an oxide layer disposed above the first floating gate portion and adjacent to the second floating gate portion.

14. The electrically erasable programmable memory cell of claim 1, wherein the second floating gate portion is not lithographically defined in a direction perpendicular to a source line direction.

15. The electrically erasable programmable memory cell of claim 1, wherein the first floating gate portion and the second floating gate portion are disposed above an upper surface of the substrate.

16. An electrically programmable and erasable non-volatile memory cell comprising:
- a substrate having a drain region, a source region, a channel region between the drain region and source region, and an upper surface; the channel region including a first channel sub-region adjacent the drain region and a second channel sub-region adjacent the source region and positioned between the first channel sub-region and the source region;
- an electrically conductive control gate separated from the first channel sub-region by a control gate insulation region; and
- an electrically conductive floating gate having (i) a first portion separated from the second channel sub-region by a floating gate insulation region and disposed above the upper surface of the substrate and (ii) a second portion disposed above the upper surface of the substrate and electrically coupled to the first portion and extending vertically from the first portion and away from the upper surface of the substrate, wherein the first portion of the floating gate has a first vertical extent relative to the upper surface of the substrate and the second portion of the floating gate has a second vertical extent relative to the upper surface of the substrate that is at least twice the first vertical extent of the first portion of the floating gate relative to the upper surface of the substrate;
- an electrically conductive source line, electrically coupled to the source region, extending vertically away from the substrate, and separated from the second portion of the floating gate by a source line insulation region, capacitively coupling the floating gate to the source line with a first capacitive coupling;
- wherein the first portion of the floating gate includes a portion that extends, over the upper surface of the substrate, further from the source line than the second portion of the floating gate; and
- an electrically conductive erase gate disposed over and separated by an erase gate insulation region from the second portion of the floating gate.

17. The electrically programmable and erasable non-volatile memory cell of claim 16, wherein the source line insulation region includes a portion positioned between and in contact with the second portion of the floating gate and the source line.

18. A method of operating a memory cell, the memory cell comprising a semiconductor substrate; a control gate; a floating gate disposed above an upper surface of the substrate, the floating gate having a first floating gate portion extending parallel to the substrate and a second floating gate portion extending away from the substrate, the second floating gate portion being electrically connected to the first floating gate portion on a first end and having a tip on a second end; a source line capacitively coupled to the second floating gate portion by a dielectric layer that includes a portion positioned between and in contact with the second floating gate portion and the source line; and an erase gate insulated from and disposed over the tip of the second floating gate portion; wherein the first floating gate portion includes a portion that extends, over the substrate, further from the source line than the second floating gate portion;
the method comprising:
erasing the memory cell by:
- applying a first bias potential to the control gate and the source line; and
- applying a second bias potential to the erase gate, inducing tunneling of electrons from the tip of the second floating gate portion to the erase gate, wherein a capacitive coupling between the floating gate and the source line substantially limits changes in potential of the floating gate caused by capacitive coupling between the floating gate and the erase gate;
- wherein a difference between the second bias potential and the first bias potential is no greater than 10 volts.

19. The method of claim 18, further comprising, after erasing the memory cell, reading the memory cell by:
- applying the first bias potential to the source line;
- applying a third bias potential to the control gate causing formation of an inversion layer in a substrate region below the control gate;
- applying a fourth bias potential to a drain region of the substrate causing a current above a threshold to flow from the drain region to the source line if the floating gate is in a predefined erased state; and
- sensing the current, if any, flowing from the drain region to the source line.

20. The method of claim 18, further comprising, after erasing the memory cell, programming the memory cell by:
- applying the first bias potential to the erase gate; and
- applying a fifth bias potential to a drain region of the substrate;
- applying a sixth bias potential higher than the fifth bias potential to the control gate; and
- applying a seventh bias potential higher than the sixth bias potential to the source line, causing a voltage of the floating gate to rise in accordance with the seventh bias potential due to capacitive coupling between the source line and the floating gate, and thereby causing electrons in a channel region of the substrate to gain energy and to be injected onto the floating gate.

21. The method of claim 20, wherein the electrons injected onto the floating gate cause the memory cell to reach a programmed state in less than 100 nanoseconds.

* * * * *